United States Patent
Durairajan et al.

(10) Patent No.: US 10,110,234 B1
(45) Date of Patent: Oct. 23, 2018

(54) EFFICIENT SYSTEM DEBUG INFRASTRUCTURE FOR TILED ARCHITECTURE

(71) Applicant: Xilinx, Inc., San Jose, CA (US)

(72) Inventors: Uma E. Durairajan, San Jose, CA (US); Subodh Kumar, San Jose, CA (US); Adam Elkins, San Jose, CA (US); Ghazaleh Mirjafari, San Jose, CA (US); Amitava Majumdar, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/654,506

(22) Filed: Jul. 19, 2017

(51) Int. Cl.
  *H03K 19/177* (2006.01)
  *G01R 31/3185* (2006.01)

(52) U.S. Cl.
  CPC . *H03K 19/1772* (2013.01); *G01R 31/318552* (2013.01); *G06F 2217/62* (2013.01)

(58) Field of Classification Search
  CPC ........... H03K 19/177; H03K 19/17704; H03K 19/17716; H03K 19/1772; G06F 11/22; G06F 11/36
  See application file for complete search history.

(56) References Cited

U.S. PATENT DOCUMENTS

| | | | |
|---|---|---|---|
| 5,581,199 A | 12/1996 | Pierce et al. | |
| 5,682,107 A | 10/1997 | Tavana et al. | |
| 5,760,604 A | 6/1998 | Pierce et al. | |
| 5,801,546 A | 9/1998 | Pierce et al. | |
| 5,883,525 A | 3/1999 | Tavana et al. | |
| 6,591,369 B1* | 7/2003 | Edwards | G01R 31/31903 327/39 |
| 7,546,642 B2* | 6/2009 | Williams | G06F 9/30181 712/227 |
| 8,074,210 B1 | 12/2011 | Jones | |
| 8,937,491 B2 | 1/2015 | Gaide et al. | |
| 8,983,790 B1* | 3/2015 | Merugu | G01R 31/31705 702/117 |
| 9,083,347 B1* | 7/2015 | Remla | H03K 21/38 |
| 9,213,615 B2* | 12/2015 | Matsukawa | G06F 13/38 |
| 2003/0140245 A1* | 7/2003 | Dahan | G06F 9/30047 713/190 |
| 2005/0022062 A1* | 1/2005 | Vorbach | G06F 9/30036 714/38.14 |
| 2010/0332928 A1* | 12/2010 | Li | G01B 31/31855 714/731 |

* cited by examiner

*Primary Examiner* — Jason M Crawford
(74) *Attorney, Agent, or Firm* — Steven Roberts

(57) ABSTRACT

Methods and apparatus are described for providing and operating an efficient infrastructure to implement a built-in clock stop and scan dump (CSSD) scheme for fabric blocks, such as block random access memory (BRAM), UltraRAM (URAM), digital signal processing (DSP) blocks, configurable logic elements (CLEs), and the like. This is a very useful feature for system debug and can also be applied for emulation use cases (e.g., FPGA emulation). This scheme can be applied to any tiled architecture that has highly repetitive blocks. The infrastructure may include a DFx controller shared across multiple tiled blocks with some distributed logic in each block, in an effort to minimize or at least reduce area overhead. The infrastructure may also minimize or at least reduce utilization of fabric resources in an effort to ensure the least perturbation of the original design, such that the design issues being debugged can be easily reproduced.

17 Claims, 15 Drawing Sheets

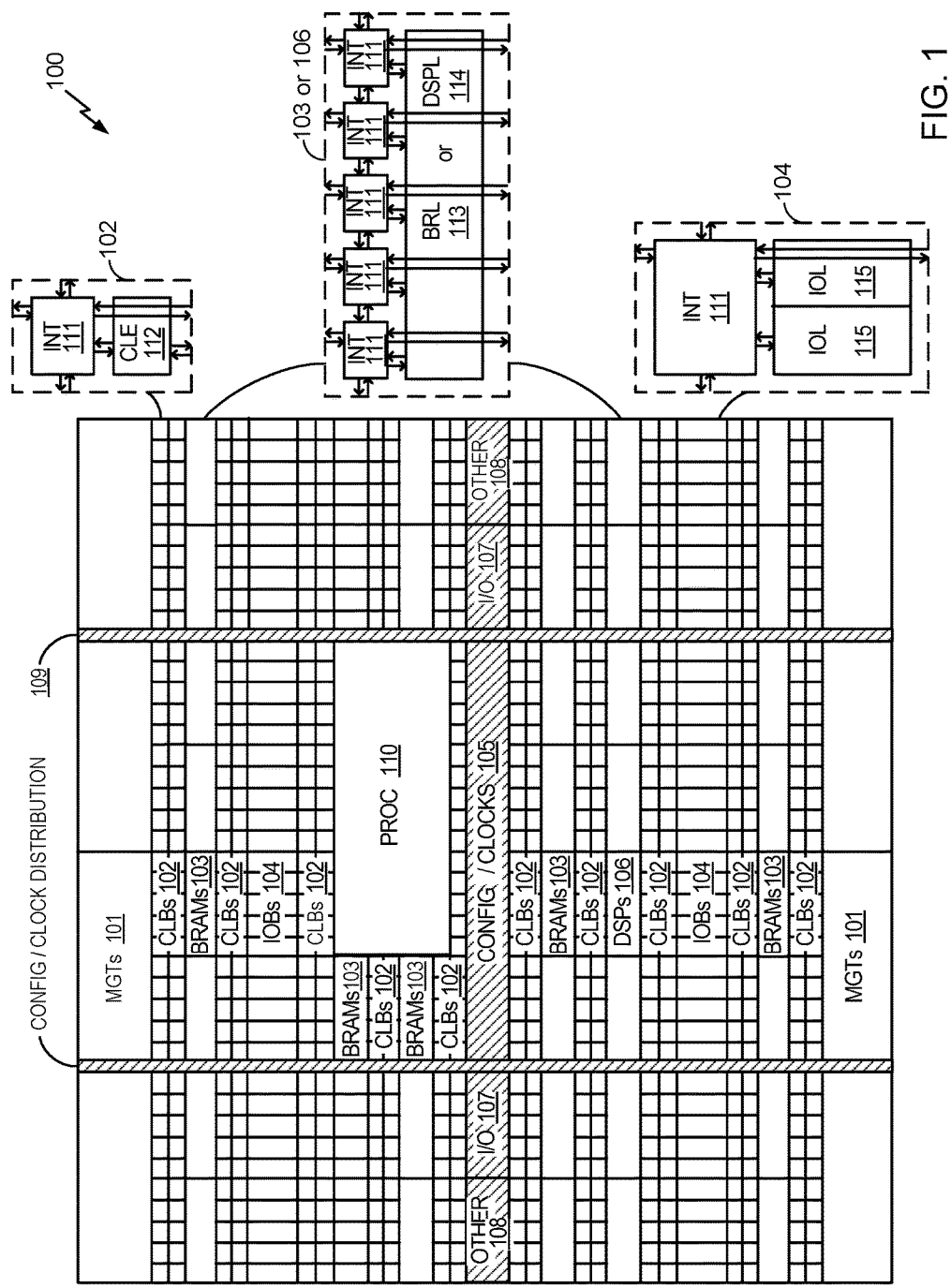

FIG. 3A Signal name legend

① cssd_stop_done_ext
② cssd_stop_done_ft0/1
③ cssd_stop_done_out
④ cssd_stop_done_in
⑤ cssd_stop_ck_bcast
⑥ cssd_stop_ck_rndrbn_ft0/1
⑦ cssd_stop_ck_rndrbn_out
⑧ cssd_stop_ck_rndrbn_in
⑨ mc_dfx_rootclk_sel
⑩ dfx_root_clk_ft0/1
⑪ dfx_root_clk_out
⑫ dfx_root_clk_in
⑬ mc_cssd_clksync_byp_selb
⑭ scan_clk_ext
⑮ scan_clk_to_dfx
⑯ cssd_scan_clk
⑰ scan_en_ext
⑱ scan_en_to_dfx
⑲ cssd_scan_en
⑳ dfx_test_mode_en
㉑ scan_en_int (To all internal flops)
㉒ mc_scan_test_en
㉓ mc_cssd_en
㉔ dfx_test_mode_en (Clk gating for shadow scan flops)
㉕ sc_scan_data_in_top
㉖ scan_data_ext_in[n-1]
㉗ sc_scan_data_out_top
㉘ scan_data_ext_out[m-1]
㉙ mc_scan_in_from_fabric[0]
㉚ scan_data_ext_in[0]
㉛ scan_data_ext_out[m]
㉜ sc_scan_data_out_bot
㉝ sc_scan_data_in_bot
㉞ Disable async reset to all flops
㉟ mc_scan_in_from_fabric[n-1]
㊱ clk
㊲ mc_clk_inv
㊳ scan_clk_mux
㊴ cfg_clk
㊵ ring_clk
㊶ scan_ck_sel
㊷ cfg_ck_sel, ring_sel, mc_clk_inv
㊸ cssd_rst_dis
㊹ clk_int (To all COE flops)

FIG. 3B

FIG. 3C Signal name legend

① cssd_stop_done_ext
② cssd_stop_done_ft0/1
③ cssd_stop_done_out
④ cssd_stop_done_in
⑤ cssd_stop_ck_bcast_out
⑥ cssd_stop_ck_rndrbn_ft0/1
⑦ cssd_stop_ck_rndrbn_out
⑧ cssd_stop_ck_rndrbn_in
⑨ mc_dfx_rootclk_sel
⑩ cssd_stop_bcast_ft0/1
⑪ root_clk_to_dfx
⑫ dfx_root_clk_ext
⑬ mc_cssd_clksync_byp_selb
⑭ scan_clk_ext
⑮ scan_clk_to_dfx
⑯ cssd_scan_clk
⑰ scan_en_ext
⑱ scan_en_to_dfx
⑲ cssd_scan_en
⑳ dfx_test_mode_en
㉑ scan_en_int (To all internal flops)
㉒ mc_scan_test_en
㉓ mc_cssd_en
㉔ dfx_test_mode_en (Clk gating for shadow scan flops)
㉕ sc_scan_data_in_top
㉖ scan_data_ext_in[n-1]
㉗ sc_scan_data_out_top
㉘ scan_data_ext_out[m-1]
㉙ mc_scan_in_from_fabric[0]
㉚ scan_data_ext_in[0]
㉛ scan_data_ext_out[m]
㉜ sc_scan_data_out_bot
㉝ sc_scan_data_in_bot
㉞ Disable async reset to all flops
㉟ mc_scan_in_from_fabric[n-1]
㊱ clk
㊲ mc_clk_inv
㊳ scan_clk_mux
㊴ cfg_clk
㊵ ring_clk
㊶ scan_ck_sel
㊷ cfg_ck_sel, ring_sel, mc_clk_inv
㊸ cssd_rst_dis
㊹ clk_int (To all COE flops)
㊺ cssd_stop_ck_bcast_in

FIG. 3D

FIG. 4 Signal name legend

① sc_scan_data_in_top
② scan_data_ext_in[3]
③ mc_scan_in_from_fabric[3]
④ scan_data_ext_in[2]
⑤ mc_scan_in_from_fabric[2]
⑥ scan_data_ext_in[1]
⑦ mc_scan_in_from_fabric[1]
⑧ scan_data_ext_in[0]
⑨ mc_scan_in_from_fabric[0]
⑩ sc_scan_data_in_bot
⑪ sleep
⑫ mc_en_pwrgate
⑬ scan_clk_mux
⑭ clk
⑮ scan_data_ext_out[3]
⑯ scan_data_ext_out[2]
⑰ sc_scan_data_out_bot
⑱ sc_scan_data_out_top
⑲ scan_data_ext_out[1]
⑳ scan_data_ext_out[0]

FIG. 4A

EFFICIENT SYSTEM DEBUG INFRASTRUCTURE FOR TILED ARCHITECTURE

TECHNICAL FIELD

Examples of the present disclosure generally relate to integrated circuits (ICs) and, more particularly, to a debugging infrastructure for ICs with a tiled architecture.

BACKGROUND

Electronic devices (e.g., computers, laptops, tablets, copiers, digital cameras, smart phones, and the like) often employ integrated circuits (ICs, also known as "chips"). In the design of ICs, there are several design methodologies, such as design for test (DFT), design for manufacturing (DFM), and design for debug (DFD) (collectively known as "DFx"), that can be used to increase the testability, fault coverage, and/or manufacturing yield of the ICs. Scan insertion (the conversion of flip-flops into scan flip-flops to form scan chains) is an example technique used in digital IC design to allow production testers to check for any manufacturing faults of the IC using the aid of the scan chains.

SUMMARY

One example of the present disclosure is a circuit with debugging support. The circuit generally includes a plurality of replicated circuit blocks and a clock distribution region. The clock distribution region is coupled to each of the plurality of replicated circuit blocks, is configured to distribute at least one clock signal to each of the plurality of replicated circuit blocks, and includes a debug controller configured to control the plurality of replicated circuit blocks during a debugging operation.

Another example of the present disclosure is a method of performing a debugging operation. The method generally includes controlling, with a debug controller, a plurality of replicated circuit blocks during the debugging operation, the debug controller being disposed in a clock distribution region coupled to each of the plurality of replicated circuit blocks and configured to distribute at least one clock signal to each of the plurality of replicated circuit blocks.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

FIG. 1 is a block diagram illustrating an example architecture for a programmable device.

FIG. 2 is divided into FIGS. 2A, 2B, and 2C, where certain signals (labeled "A" through "N") are connected between FIGS. 2A and 2B, where certain other signals (labeled "O" through "Z") are connected between FIGS. 2B and 2C, and where FIG. 2B includes a signal name legend for signals illustrated in FIG. 2A (which also applies to corresponding, but unlabeled signals shown in FIG. 2C).

FIG. 3B provides a signal name legend for signals depicted in FIG. 3A.

FIG. 3D provides a signal name legend for signals illustrated in FIG. 3C.

FIG. 4A provides a signal name legend for signals shown in FIG. 4.

DETAILED DESCRIPTION

Figure 2A:
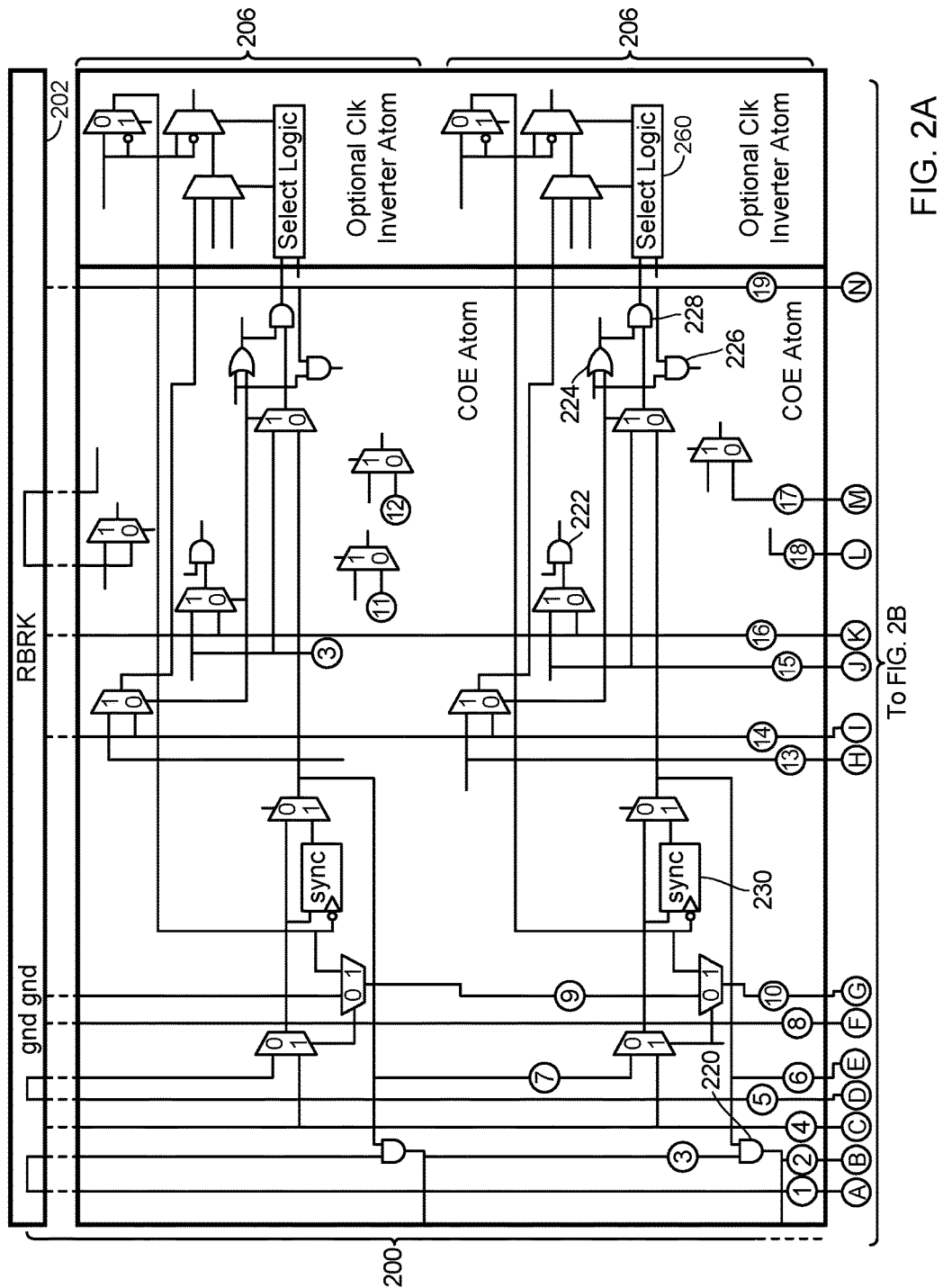
FIG. 2 is a block diagram of an example fabric sub-region (FSR) illustrating a DFx controller disposed in the regional clock (RCLK) and shared among multiple blocks, in accordance with an example of the present disclosure.

Examples of the present disclosure provide techniques and apparatus for providing and operating an efficient infrastructure to implement a built-in clock stop and scan dump (CSSD) scheme for fabric blocks, such as block random access memory (BRAM), UltraRAM (URAM), digital signal processing (DSP) blocks, configurable logic elements (CLEs), and the like. This is a very useful feature for system debug and can also be applied for emulation use cases (e.g., FPGA emulation). This scheme can be applied to any tiled architecture that has highly repetitive blocks. The infrastructure may include a DFx controller shared across multiple tiled blocks with some distributed logic in each block, in an effort to minimize or at least reduce area overhead. The infrastructure may also minimize or at least reduce utilization of fabric resources in an effort to ensure the least perturbation of the original design, such that the design issues being debugged can be easily reproduced.

Example Programmable Integrated Circuits

Integrated circuits (ICs) may be implemented to perform specified functions. One type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

FIG. 1 is a block diagram illustrating an example architecture 100 for a programmable device. The architecture 100 may be implemented within a field programmable gate array (FPGA), for example. As shown, the architecture 100 includes several different types of programmable circuitry (e.g., logic blocks). For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example System Debug Infrastructure for Tiled Architecture

A commonly used scheme for system debugging entails stopping the clock at a certain point in time and performing a scan dump. The scan dump may then be used to observe the state of the flops in the system, which may facilitate the debug process. This mechanism is called clock stop and scan dump (CSSD) and can be used to debug a design implemented on a programmable IC (e.g., an FPGA) or an ASIC. CSSD may also be used for programmable IC emulation customers in an effort to capture complete design state information at any given time.

Conventional designs implemented CSSD by having a built-in, dedicated DFx controller in each block, with sufficient logic to count clock (clk) cycles, compare the count value to a predetermined value, and stop the clock when the predetermined value has been reached (a clock stop sequence). Once all clocks are stopped, the DFx controller may then assert a scan enable signal and begin toggling a scan clock signal to start a scan dump operation. The user (e.g., a debug engineer) may then use the scan dump output, create waveforms, and/or analyze the state of the flops to efficiently debug the design. As used herein, a "DFx controller" generally refers to a controller capable of performing design for test (DFT), design for manufacturing (DFM), and/or design for debug (DFD).

For small repetitive blocks in an IC (e.g., the fabric blocks in an FPGA, such as those in the architecture 100 of FIG. 1), however, implementing a dedicated DFx controller for each block involves significant built-in area overhead. This area overhead may be considered excessive for the fabric blocks in an FPGA, such as CLBs, BRAM, UltraRAM (URAM), DSP, etc. Since these are highly repetitive blocks in the programmable IC, these blocks may be very area sensitive, where any small increase may have a big impact on die size. Moreover, a dedicated DFx controller in each block may also lead to significant fabric usage, which may make it difficult to employ such a CSSD scheme in designs with high utilization already.

An alternative may include having the user implement the DFx controller with fabric resources. In some designs, especially those involving access to the tile units (e.g., BRAM units), the fabric resources for implementing CSSD may not be readily available and may, in fact, be prohibitive. Furthermore, adding additional logic for debug purposes may actually perturb the original design and change the nature of the failure being debugged, enough so that the original failures may not be reproducible, thereby defeating the purpose of a CSSD scheme.

Examples of the present disclosure provide an efficient infrastructure to implement a built-in CSSD scheme. This CSSD scheme may be applied to any tiled architecture that has highly repetitive blocks, especially for blocks (e.g., fabric blocks) that are sensitive to any area growth, such as BRAM, URAM, DSP blocks, CLBs, and the like. This is a very useful feature for system debug and can also be applied for emulation use cases (e.g., FPGA emulation). The infrastructure may include a DFx controller shared across multiple tiled blocks with some distributed logic in each block, in an effort to minimize or at least reduce area overhead. The infrastructure may also minimize or at least reduce utilization of fabric resources in an effort to ensure the least perturbation of the original design, such that the design issues being debugged can be easily reproduced.

With this CSSD scheme, some of the logic may be distributed into individual blocks and have a hand shake sequence between the shared DFx controller and the individual blocks. Examples of the present disclosure may seamlessly handle clock stopping for multiple clock domains distributed in the different blocks, provide options for sequential or simultaneous stopping of the different clocks, handle any unused blocks in the mix that have no clock toggling, automatically bypass any power-gated flops in the scan chain, efficiently utilize pipeline registers no used in the design as shadow flops, and/or provide options for single or multiple scan chain with a built-in option for recirculation of scan data.

In a typical programmable IC columnar architecture (e.g., the example architecture 100 in FIG. 1), the fabric blocks are instantiated in columns. For example, a URAM column may include 24 URAM288 instances in one clock region (one fabric sub-region (FSR)) with a regional clock (RCLK) in the middle. While BRAM and URAM blocks are used below for ease of description, examples of the present disclosure may be applied to any blocks with a tiled architecture.

Figure 2B:
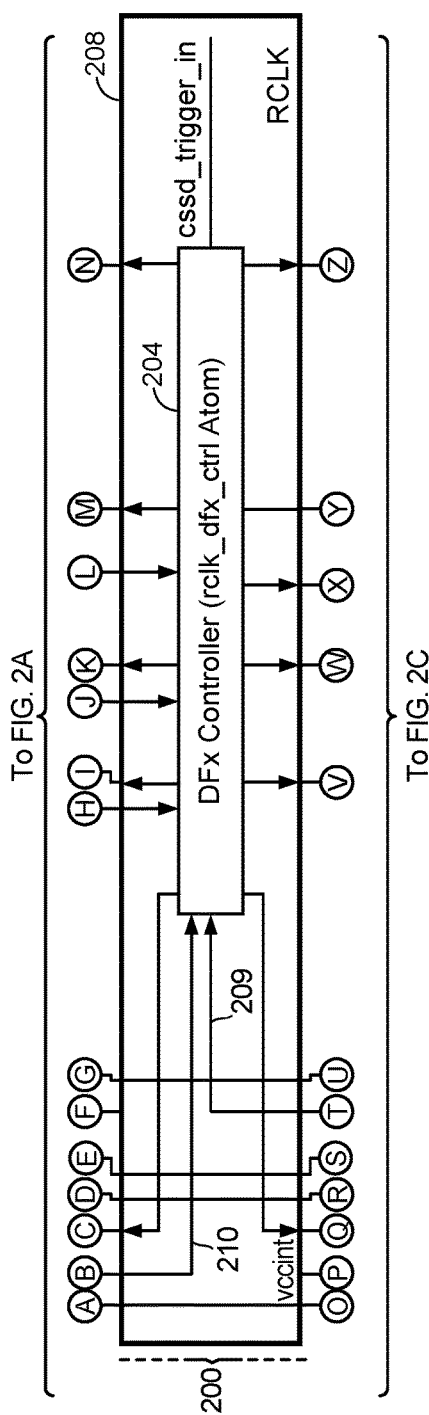
Figure 2C:
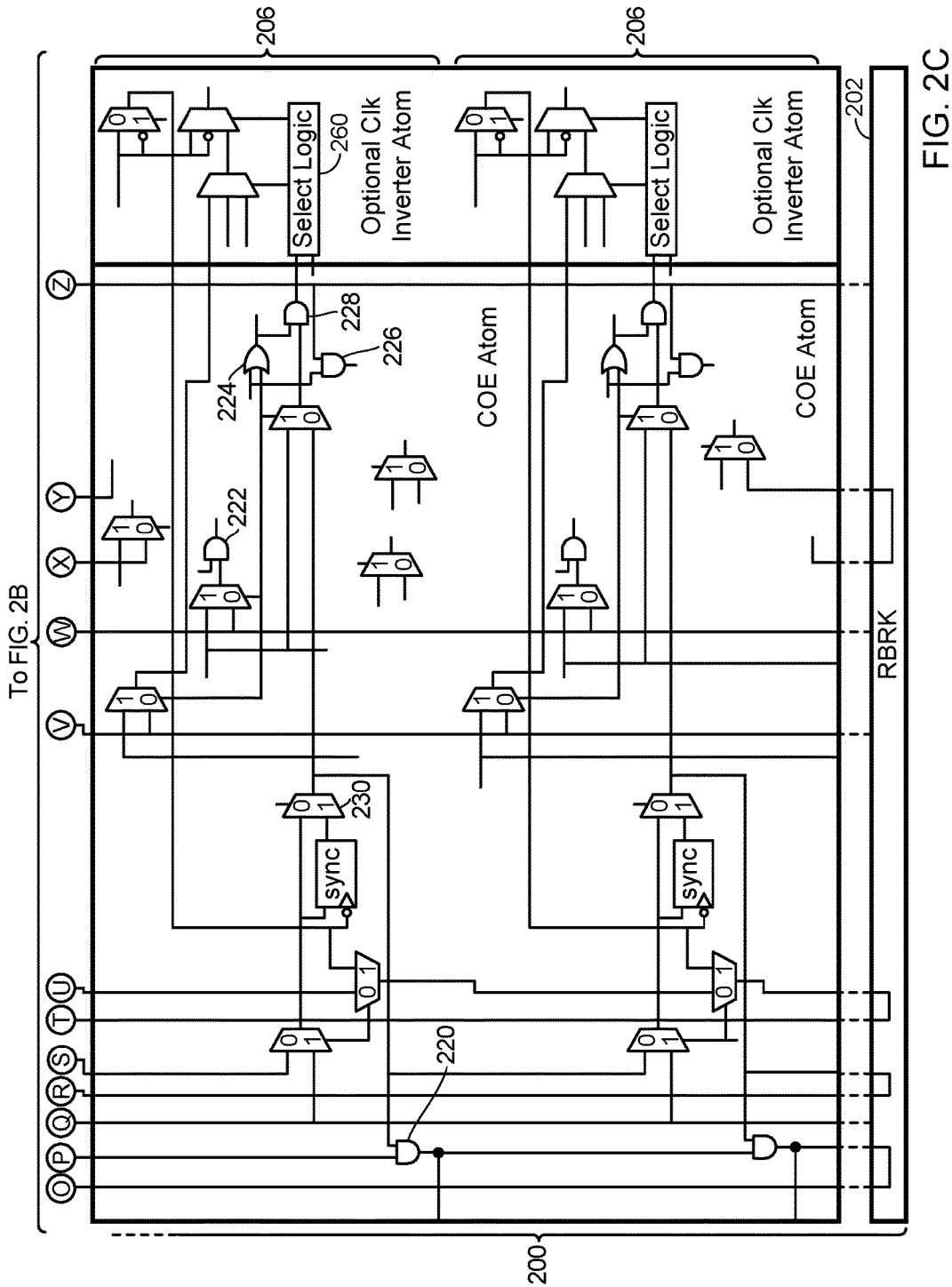

FIG. 2 is a block diagram of an example FSR 200 (also referred to as a clock region) in an IC, illustrating the infrastructure for supporting a built-in CSSD scheme, in accordance with an example of the present disclosure. The FSR 200 may be bounded by regional breaks (RBRKs) 202 defining where one FSR ends and another begins. Each FSR 200 includes a DFx controller 204 shared among multiple blocks 206, with some supporting CSSD logic distributed in each block. This common DFx controller 204 is used to control these multiple blocks 206.

For some examples, the common DFx controller 204 is disposed in RCLK 208 (e.g., RCLK_DFX_TEST offered as a primitive in the UNISIM library available from Xilinx, Inc. of San Jose, Calif.). The DFx controller 204 may control multiple blocks 206 (e.g., URAM blocks) above and below RCLK 208 (e.g., 12 URAMs above and 12 URAMs below, although only two above and two below are illustrated in FIG. 2). Thus, a dedicated DFx controller need not be included in each block 206. Because RCLK 208 may likely have unused area available, having a shared DFx controller 204 may involve negligible area overhead. Some of the DFX controller logic may be distributed in each block 206. Hence, several handshake signals may be utilized between the central DFx controller 204 and the individual blocks 206. These handshake signals may be implemented using vertical tracks in the column, and there should be sufficient routing resources available in the blocks 206 in this direction. Since these are dedicated routes built into the blocks 206, these tracks designated for handshake signals do not use any fabric resources.

Figure 3A:
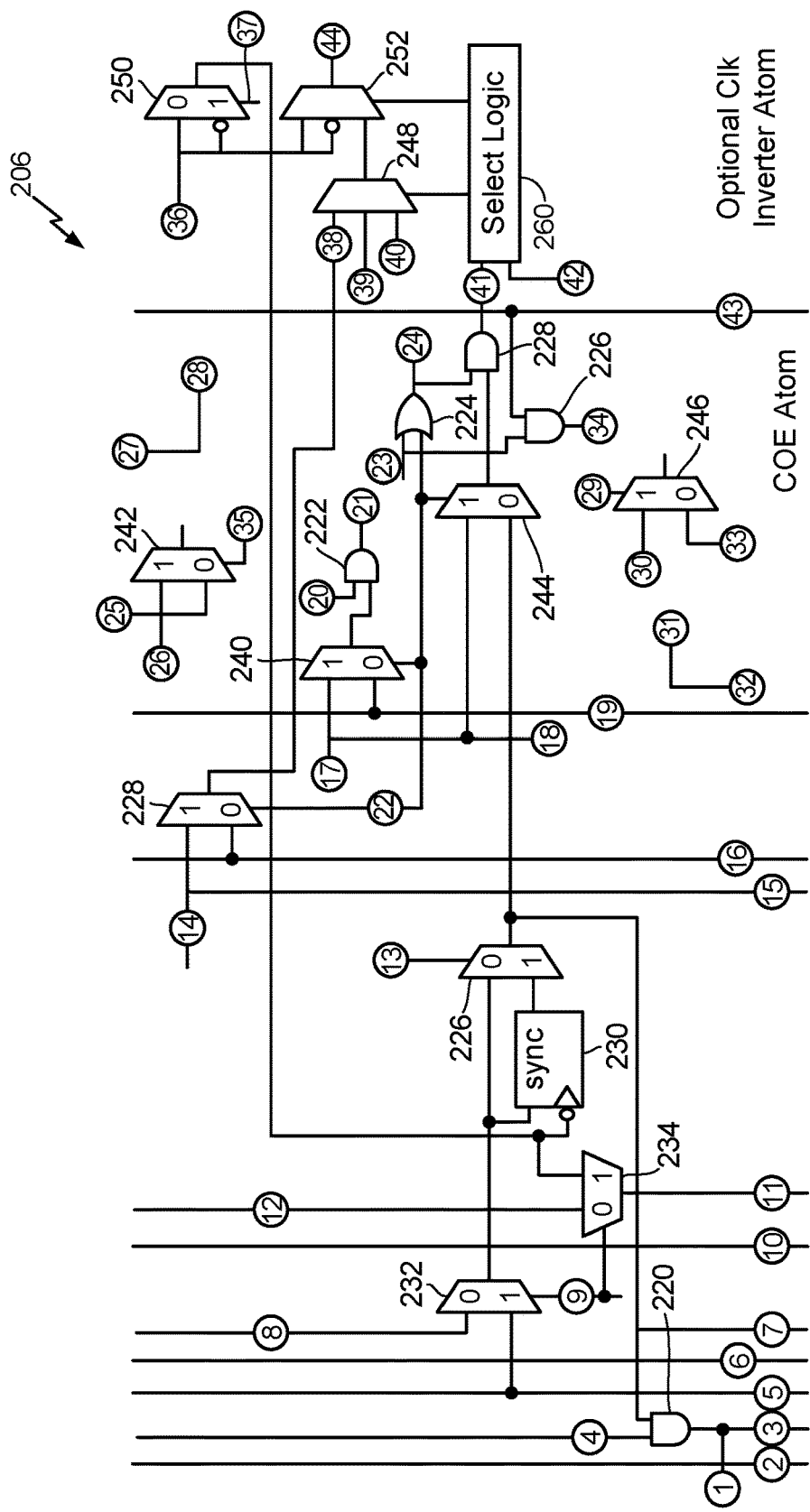
FIG. 3A is a block diagram illustrating example DFx circuit details in each block, in accordance with an example of the present disclosure.

The details of the distributed DFX controller logic for each block 206 are illustrated in FIG. 3A, but are also represented in FIG. 2. Although certain signals in FIG. 2 appear to be floating and disconnected from other components, these signals are shown in the detailed illustration of FIG. 3A and are explicitly named in FIG. 3B. A person having ordinary skill in the art will understand how these signals are connected in and between the various blocks 206 to implement this infrastructure for supporting a built-in CSSD scheme, as described herein. The distributed logic for each block 206 may include gates 220, 222, 224, 226, and 228; flip-flop 230; multiplexers (MUXes) 232, 234, 236, 238, 240, 242, 244, 246, 248, 250, and 252; and selection logic 260, which may be connected as illustrated in FIG. 3A. The scan chain infrastructure in the blocks 206 may be used for both silicon defect isolation and for system debug. The scan test mode for silicon defect isolation can be used without using the shared DFx controller 204.

Each block 206 may have one or more clock inputs. For example, each BRAM block has four clock inputs, and hence, in each FSR column, there may be 96 (=4*(12+12)) clock inputs. The user may stop the clock based on any one of these clock signals (referred to as the "root clock"). However, it may be challenging to route 96 clock signals to the common DFX controller 204 in RCLK 208. Hence, a serial multiplexing (MUXing) scheme may be implemented to select the desired clock (e.g., using mcell programming) and to propagate this clock (dfx_root_clk 209) to the DFx controller 204.

To start the CSSD sequence, a CSSD trigger input signal (cssd_trigger_in) may be asserted. The CSSD trigger input may be routed (directly) to the DFx controller 204 by the user, using the fabric resources in the design.

The DFx controller 204 may broadcast a stop signal (cssd_stop_ck_bcast) to all the blocks 206 under control of the DFx controller (e.g., all the blocks in the FSR 200). The broadcast stop signal may be synchronized locally in each block 206, and a sequential clock stop sequence may be started using stop clock round robin handshake signals (cssd_stop_ck_rndrbn_in/out). The user may have flexibility to stop one or more clocks simultaneously as desired.

Similarly, a stop clock done signal (cssd_stop_done_in/out) may be serially propagated from one block 206 to another block (e.g., an adjacent block). A final stop done output signal 210 may be sent to the DFx controller 204 and/or to the fabric output for external use.

Note that the serial propagation of the root clock and stop clock signals may render these signals asynchronous and may introduce some non-determinism in the clock stoppage. With local synchronizers (e.g., the flip-flop 230), the clocks in each block 206 may be guaranteed to be stopped glitch-free. This may be due to the local synchronizers being falling edge synchronizers, triggered on the falling edge of the root clock. However, some non-determinism in the actual clock count stoppage may exist, but this can usually be tolerated for system debug and is considered acceptable. If a more deterministic stop is desired, an alternate scheme is described below with respect to FIG. 3C.

Figure 4:
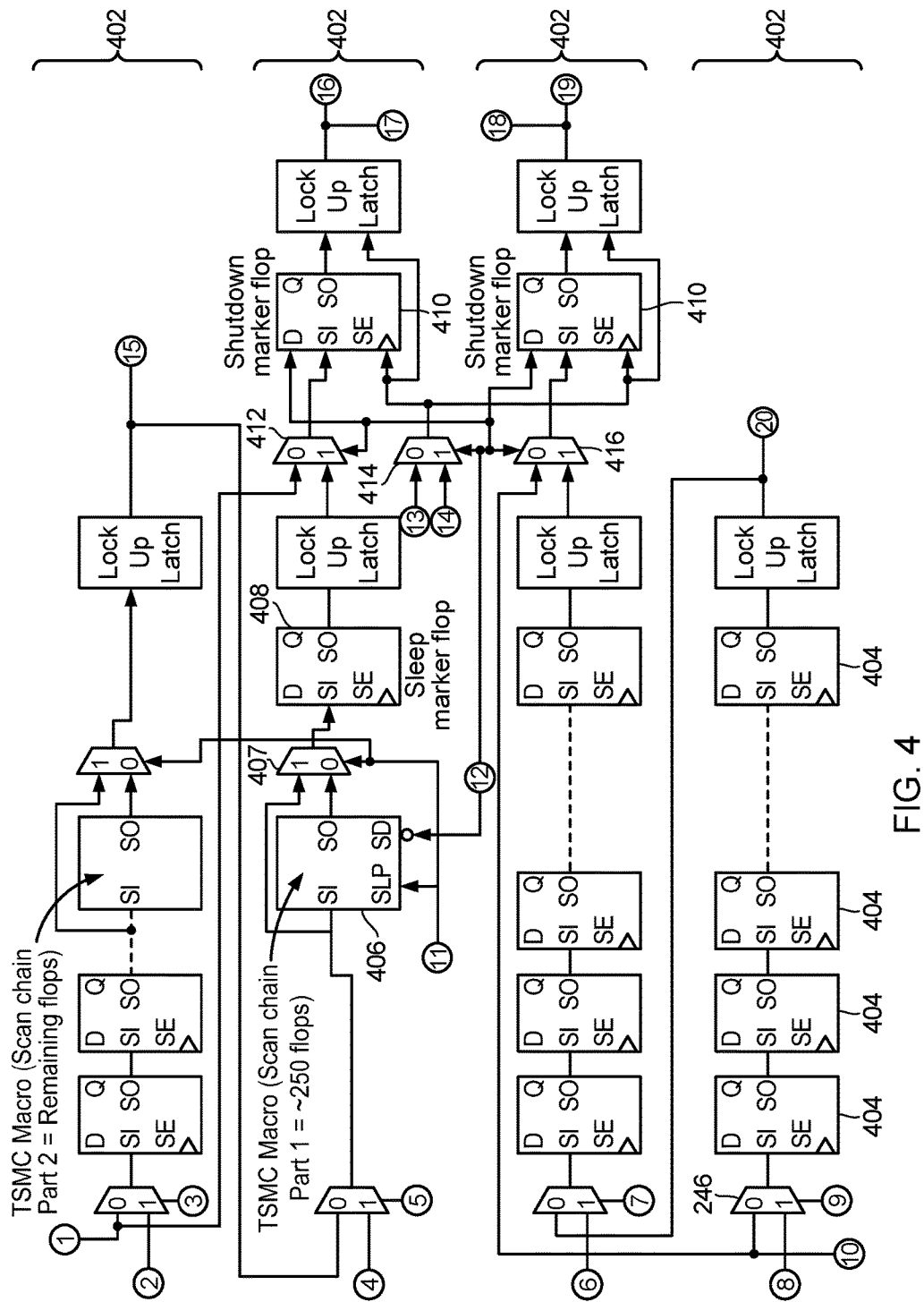
FIG. 4 is a block diagram of an example scan chain, in accordance with an example of the present disclosure.

FIG. 4 is an example scan chain diagram, illustrating multiple scan chains 402 for a single block 206, in accordance with an example of the present disclosure. The scan chains 402 from one block 206 may be concatenated with the scan chains of other blocks to form a single scan chain across all the blocks 206 controlled by the common DFx controller 204. Thus, a single scan output may be routed by the user to collect the scan dump output. Full flexibility using config mcell programming (e.g., mc_scan_in_from_fabric[n] signals) may be provided to have as many or as few scan chains as desired. Many multiple scan chains may be desired for silicon defect testing in order to reduce the tester time, whereas a single scan chain may be desired for CSSD mode in order to minimize, or at least reduce, fabric resources. Config mcells may be programmed based on the UNISIM attribute setting.

As illustrated in FIG. 4, two scan chains propagating in opposite directions in each block 206 are provided, with the option to concatenate these two scan chains in the RBRK 202. This bidirectional propagation in addition to allowing a single scan chain may also provide the option to recirculate the scan data, without using any fabric resources. Thus, at the end of the scan shift, all the flops 404 may be restored to the same state that these flops were in at the beginning of the scan shift. This recirculation is often a desired feature for FPGA emulation customers.

After the stop clock done status output signal (cssd_stop_done_out) is asserted, the user may be expected to toggle the scan clock to start the scan dump operation. The scan dump is intended ideally to provide visibility into each and every flop 404 in all the blocks 206, such that the user may debug the design.

Any unused sites in the FSR 200 may be designed to pass the handshake signals from one block 206 to another block (e.g., from a block above to a block below). The scan chain for these unused sites may also be bypassed so that any powered down logic may stay powered down. A shutdown marker flop 410 may be added at the end of a scan chain 402, as illustrated in FIG. 4, to indicate used versus unused sites. This shutdown marker flop 410 may be used to calculate the scan chain length. For some examples, the scan chain for at least a portion of a programmable IC macro 406 (e.g., a macro available from Taiwan Semiconductor Manufacturing Company (TSMC), labeled as "TSMC macro" in FIG. 4) may be bypassed in sleep mode, since such a macro may be powered down during sleep. The scan chain may be bypassed for unused sites using the config mcell mc_en_pwrgate signal, which may be routed to the programmable IC macro 406, as well as to multiplexers (MUXes) 412, 414, and 416.

Figure 5:
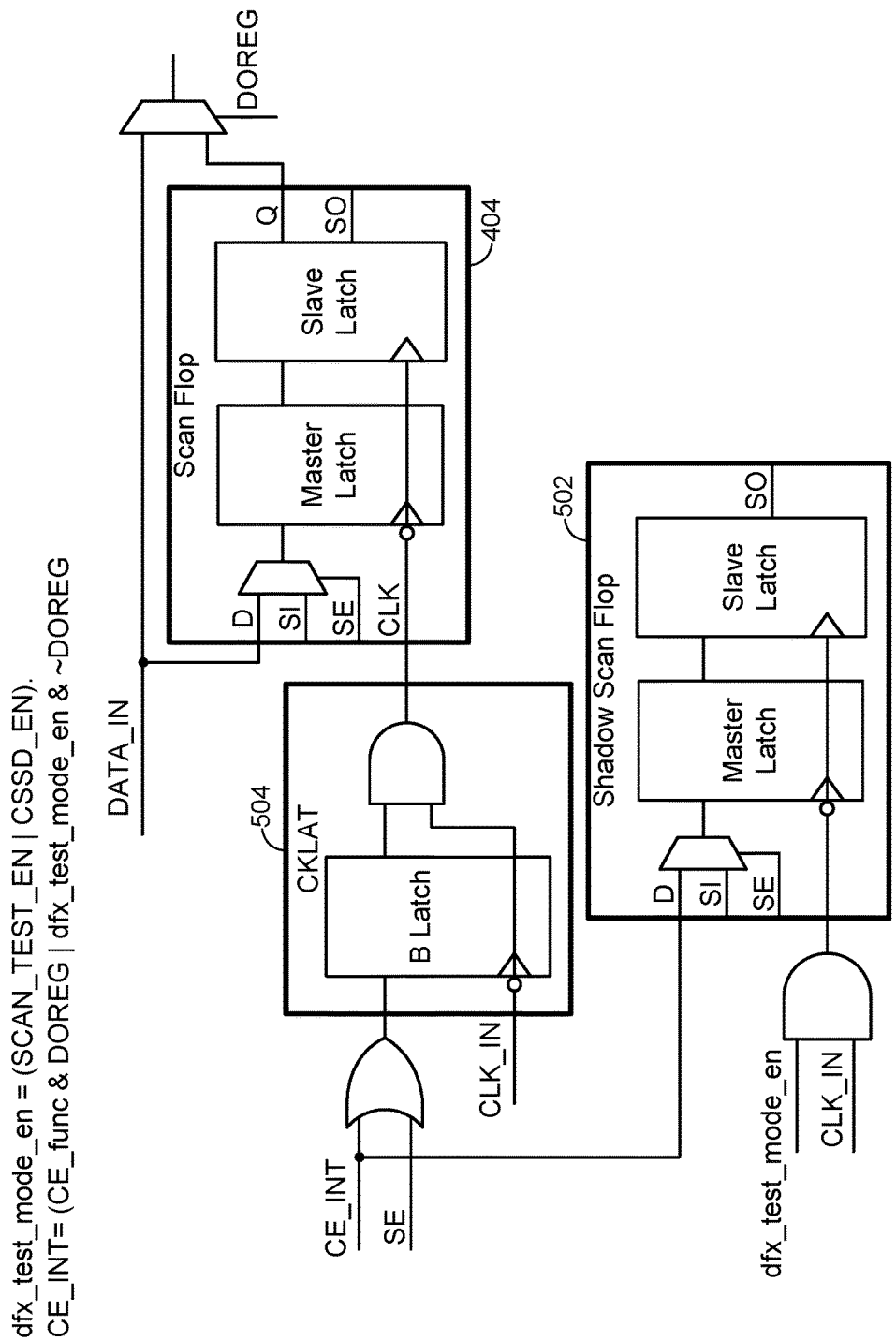
FIG. 5 is a block diagram illustrating the use of example shadow scan registers, in accordance with an example of the present disclosure.

Optional pipeline stages, even if unused in the design, may be efficiently used as shadow scan registers to provide additional observability for design debug. FIG. 5 is a block diagram illustrating the use of an example shadow scan register 502, in accordance with an example of the present disclosure. The shadow scan register 502 provides observability of the CE_INT pin itself. DOREG generally refers to the UNISIM attribute that a user can use to enable or disable the optional pipeline register. CKLAT is a standard clock gate latch 504, which is normally used for clock power saving so that the clock may toggle when CE_INT (or the scan enable signal (SE)) is logic high. CE_FUNC generally refers to the functional clock enable signal, which may be used by the original user design when DOREG=1. Thus, when DOREG=0, CE_INT may be forced to 1 if dfx_test_mode_en=1 (which implies using CSSD mode for system debug) so that the flops 404 can be used to observe the state of DATA_IN for additional debug help, even though DOREG=0 in the original design.

Figure 6:
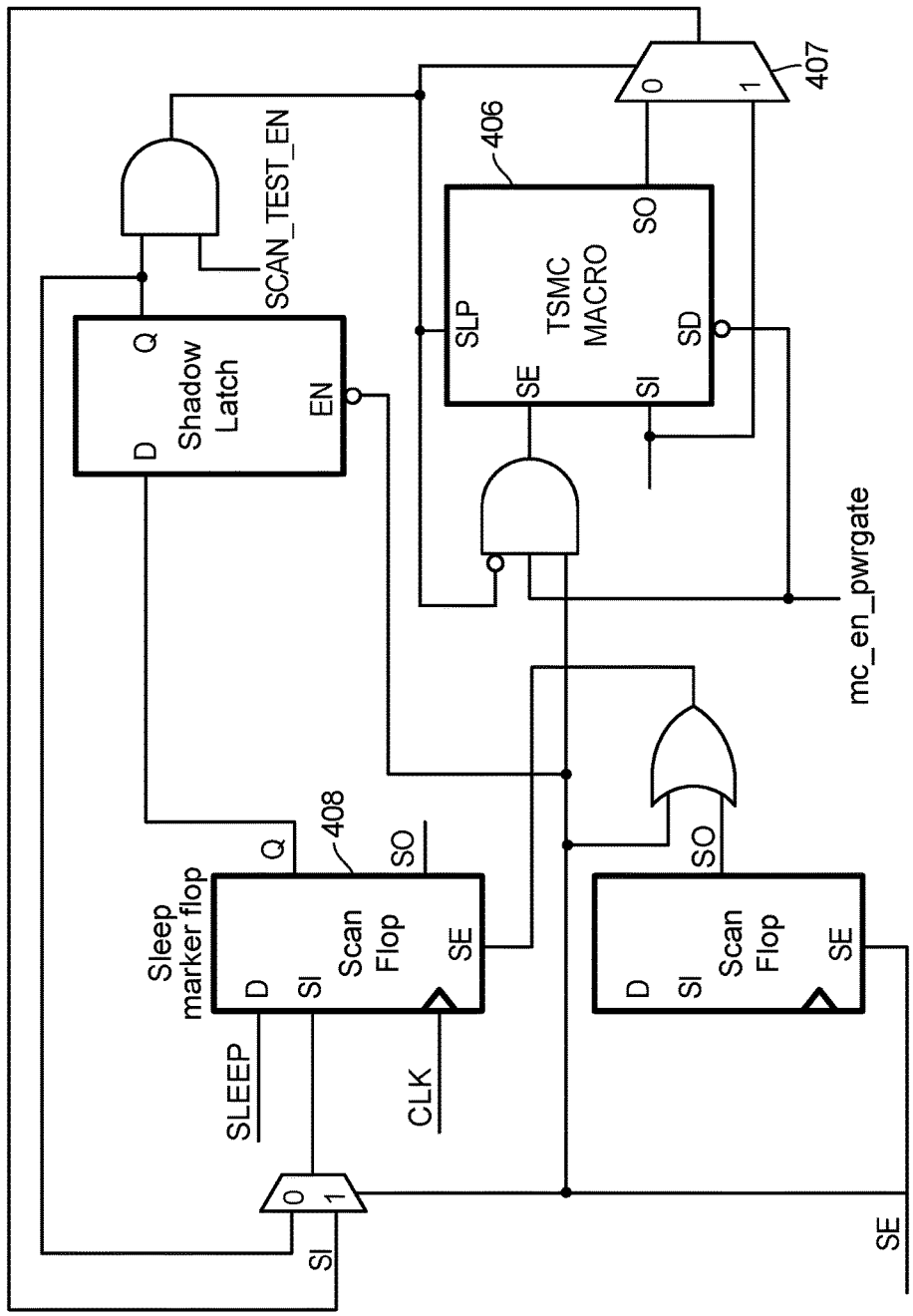
FIG. 6 is a block diagram illustrating example DFx circuit details for implementing power gating, in accordance with an example of the present disclosure.

Special circuitry may be added to handle dynamic power gating modes (e.g., sleep mode), as illustrated in FIGS. 4 and 6. In this case, the sleep state for the powered down logic may be preserved, and the powered down flops (e.g., in the programmable IC macro 406) may be bypassed in the scan chain 402. The sleep input state may be stored in a latch, and additional circuitry may be added for complete testability of the sleep-related circuitry. The sleep input (marker) flop 408 may capture the sleep state, may be placed at the end of a scan chain 402, and may be used to calculate the length of the scan chain.

According to some examples, the DFx controller 204 may be reset using a global restore (Grestore) during configuration of the user design. To use the CSSD scheme, the user design for the programmable IC may drive an external scan clock signal (e.g., scan_clk_ext, as illustrated in FIG. 3A) and a CSSD trigger input signal (e.g., cssd_trigger_in, as illustrated in FIG. 2). The user design may also use output ports with an external CSSD stop done signal (e.g., cssd_stop_done_ext as illustrated in FIG. 3A) and an external scan data output signal (e.g., scan_data_ext_out[m] as illustrated in FIGS. 3A and 4). For some examples, fabric resources may be used to route only these four signals; the remainder of the fabric resources may not be utilized for the CSSD scheme, thereby involving very little fabric resource overhead. The user may route the external scan clock signal and the external CSSD stop done signal to and from one block instance, respectively, such as the block immediately above (or below) RCLK 208, as illustrated. Depending on how the scan chain is configured, the user can decide from which block instance to tap the external scan data output signal. It may be preferable to use scan_data_ext_out[2] or scan_data_ext_out[1] from one of the URAM blocks, since these two output signals may have the sleep and/or shutdown marker flops 408, 410 at the end of the scan chain 402, which may make it easy to identify which flops in the scan chain are being bypassed, if any. The scan chain length may vary depending on the number of used sites and sleep mode of these sites. By using these marker flops 408, 410, the scan chain length can be accurately estimated.

The unused URAM sites in the FSR 200 under test may be left with default settings. Each of these unused URAM sites may automatically bypass the handshake signals from the URAM above (or below) to the URAM below (or above).

For some examples, to operate the CSSD scheme, the CSSD enable attribute (CSSD_EN, also labeled as "mc_cssd_en" signal in FIG. 3A) should be set to TRUE, whereas the scan test enable attribute (SCAN_TEST_EN, also labeled as "mc_scan_test_en" signal in FIG. 3A) should be set to FALSE. CSSD_EN may be available in RCLK 208 and used URAM blocks in the same FSR column.

The DFX root clock select attribute (DFX_ROOTCLK_SEL, also labeled as "mc_dfx_rootclk_sel" signal in FIG. 3A) may be set to the correct value for used sites, depending on the root clock that is selected for debug. The default value for unused sites may bypass the root clock for these sites.

The CSSD clock synchronization bypass select attribute (CSSD_CLKSYNC_BYP_SEL, also labeled as "mc_cssd_clksync_byp_sel" signal in FIG. 3A) may be set to a default value (e.g., TRUE) for unused sites. For used sites, the value of CSSD_CLKSYNC_BYP_SEL may be set to FALSE if the corresponding root clock toggles and to TRUE if the root clock does not toggle.

The CSSD trigger offset count attribute (CSSD_TRIG_OFFSET_COUNT) may be set to the desired count when the selected root clock is to be stopped for debugging. The CSSD_TRIG_OFFSET_COUNT may be an attribute in the RCLK_DFX_TEST UNISIM library, for example.

The SCAN_IN_FROM_FABRIC_0/1 . . . N attributes (also labeled as "mc_scan_in_from_fabric[n]" signals in FIGS. 3A and 4) may be set appropriately as follows: (1) setting all of these attributes to TRUE will result in N scan chains per block instance (shortest scan chain length possible); (2) setting all but one of these attributes to FALSE will result in a single scan chain; or (3) setting all of these attributes to FALSE will result in a single scan chain per FSR column and will allow re-circulation of data, which may be desirable for an emulation use case. A single scan chain per FSR column may be preferred in this mode to minimize the use of fabric routing resources (so that only one scan data output is routed to capture the scan dump).

Example CSSD Operations

Figure 7:
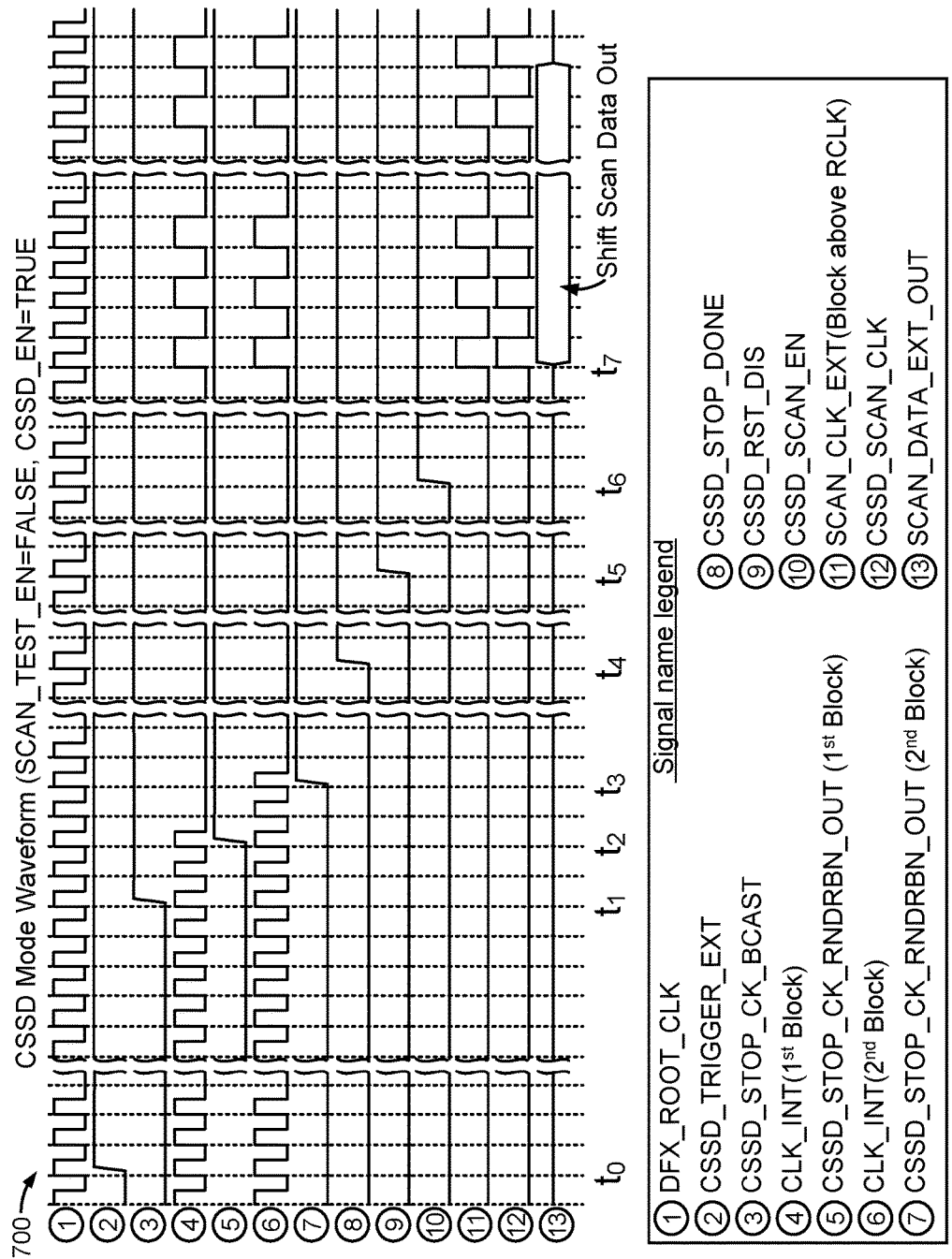
FIG. 7 is an example timing diagram in clock stop scan and dump (CSSD) mode, in accordance with an example of the present disclosure.

FIG. 7 is an example timing diagram 700 for the CSSD scheme described above with respect to FIGS. 2-6, in accordance with an example of the present disclosure. In the example of FIG. 7, CSSD_EN is set to TRUE, whereas SCAN_TEST_EN is set to FALSE.

The CSSD scheme may begin with the selected root clock (dfx_root_clk) being propagated to RCLK_DFX_TEST, which may be dictated by DFX_ROOTCLK_SEL attributes. The CSSD_TRIGGER_EXT (labeled as "cssd_trigger_in" signal in FIG. 2) may be sent to RCLK_DFX_TEST from the fabric. Once the trigger input is asserted at $t_0$, the CSSD counter in RCLK_DFX_TEST may start counting using the selected root clock. Once the CSSD counter reaches the CSSD_TRIG_OFFSET_COUNT, the DFx controller may send the cssd_stop_ck_bcast signal at $t_1$. During this time, CSSD_SCAN_CLK (labeled as "cssd_scan_clk" signal in FIG. 3A) from RCLK_DFX_TEST may stay low (and not toggle), as illustrated in FIG. 7.

The selected root clock may be stopped first, after which all the other clocks may be sequentially stopped using the cssd_stop_clk_rndrbn_in/out signals (e.g., at $t_2$ and $t_3$ for two example blocks). The cssd_stop_done signal may be propagated to RCLK_DFX_TEST at $t_4$ after all clocks in all instances of the FSR column have been stopped. Next, the DFx controller may assert the CSSD reset disable (cssd_rst_dis) signal to all blocks at $t_5$. The cssd_rst_dis signal may disable the asynchronous reset path to all flops. Afterwards at $t_6$, the cssd_scan_en signal may be asserted, and sometime later at $t_7$, the cssd_scan_clk signal may begin toggling, which will start the scan dump operation (e.g., a scan shift). To perform the scan dump, the user may drive the scan_clk_ext input signal to a block instance (e.g., the block instance immediately above RCLK 208). This clock may be used by the DFx controller 204 in RCLK 208 and propagated to all blocks 206 using the cssd_scan_clk output signal.

Deterministic Clock Stop Option

Figure 3C:
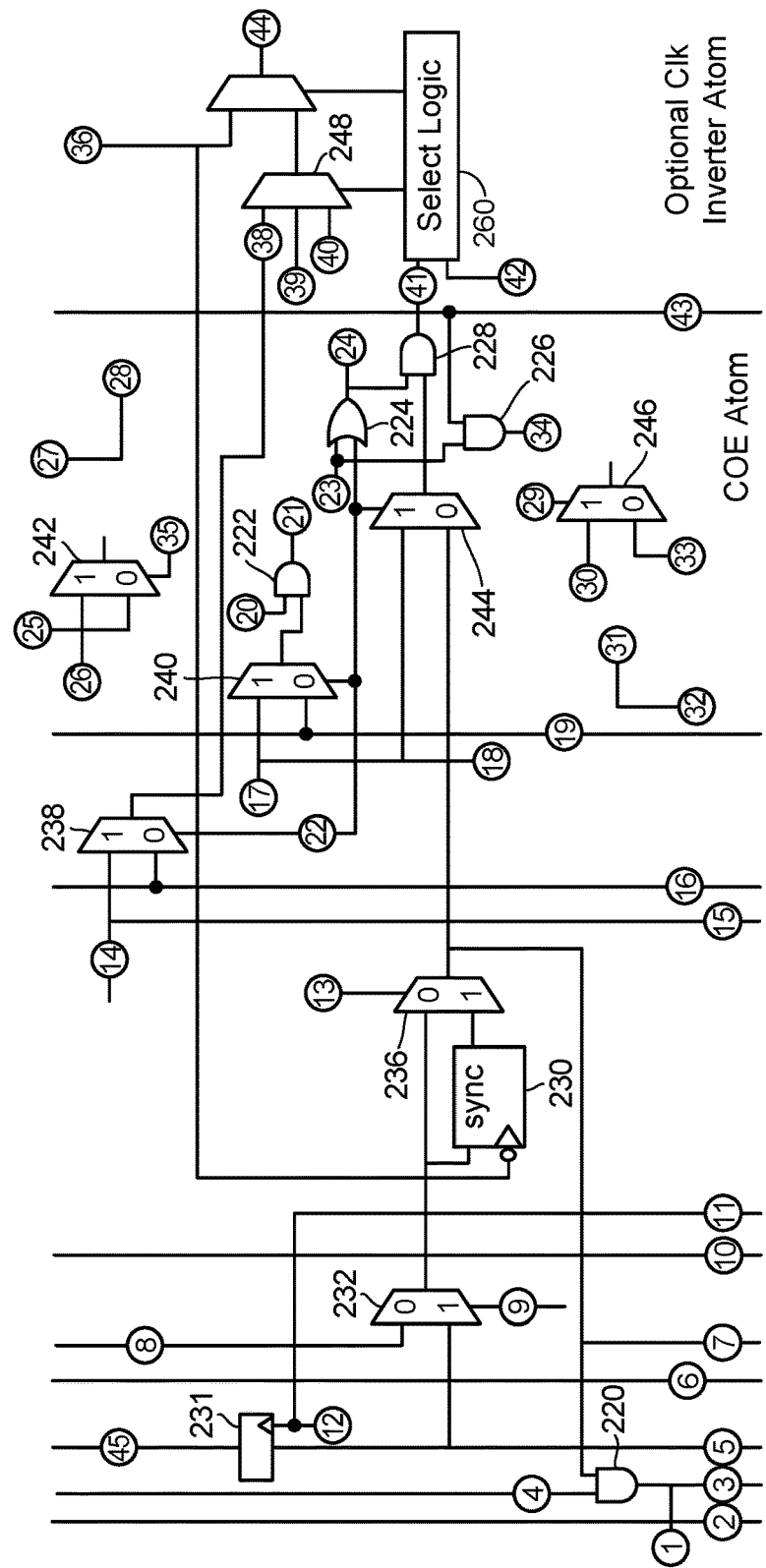
FIG. 3C is a block diagram illustrating example DFx circuit details in each block for implementing a deterministic clock stop, in accordance with an example of the present disclosure.

FIG. 3C is a block diagram illustrating example DFx circuit details in each block 206 for implementing a deterministic clock stop, in accordance with an example of the present disclosure. In FIG. 3C, the optional clock inverter is not shown for simplicity. The root clock that is selected may be routed to all the blocks 206 (e.g., using an external DFx root clock input port, labeled as "dfx_root_clk_ext" in FIG. 3C). This may incur some fabric resource overhead. However, since a clock is typically routed to many block instances already, the additional fabric resource overhead may most likely be acceptable. Since the root clock is routed to all blocks 206, the root clock need not be serially propagated to the DFx controller 204, as in FIG. 3A. Instead in FIG. 3C, the root clock from one of the blocks 206 (e.g., the block immediately above RCLK 208) may be used by the DFx controller 204. Also in FIG. 3C, the cssd_stop_ck_bcast signal from the DFx controller 204 may be synchronously generated and propagated from one block 206 to another block (e.g., an adjacent block) using dfx_root_clk_ext and an additional flip-flop 231 in each block. This will provide for a deterministic stop of the root clock.

Example Operations for Debugging

Figure 8:
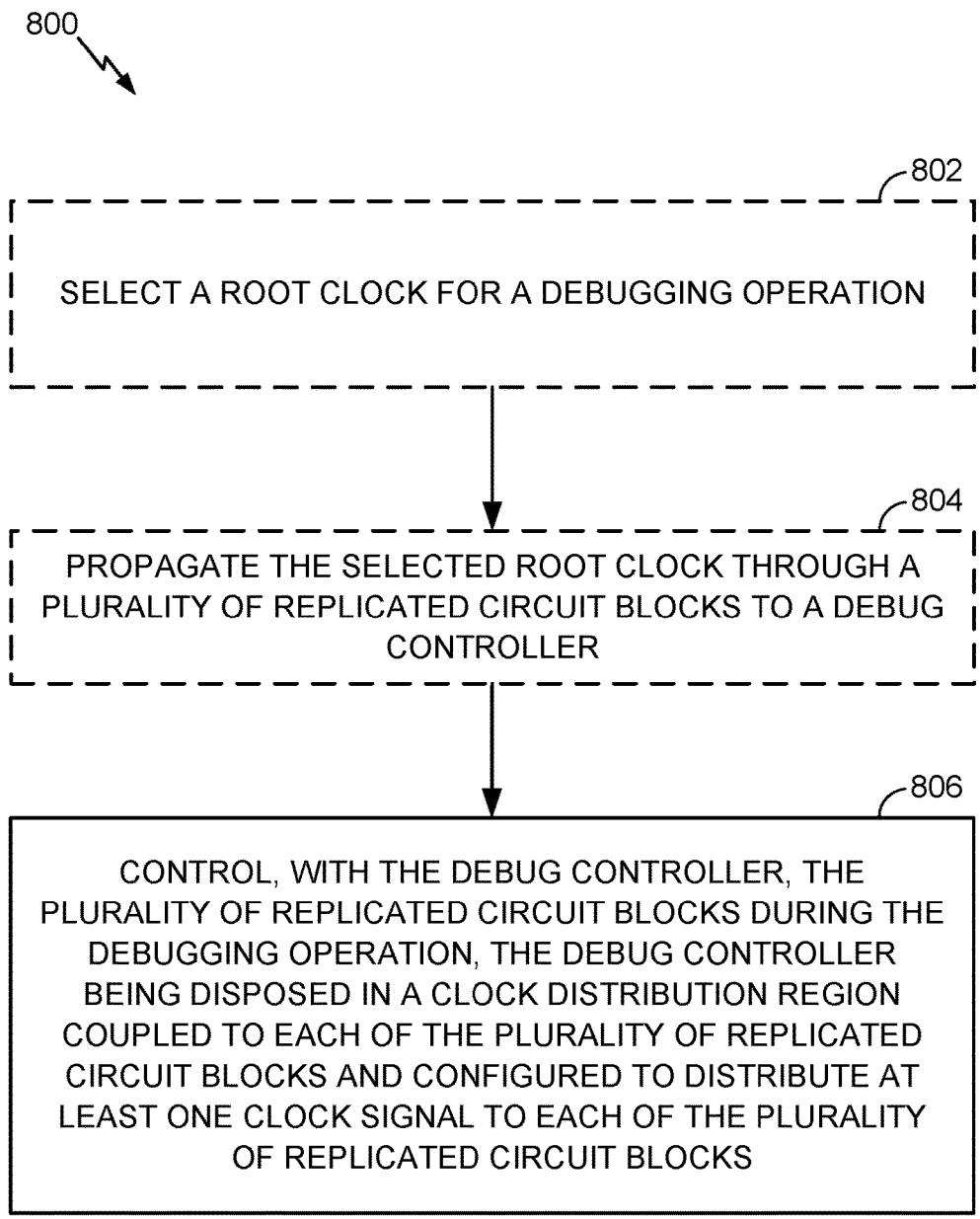
FIG. 8 is a flow diagram of example operations for performing a debugging operation, in accordance with an example of the present disclosure.

FIG. 8 is a flow diagram of example operations 800 for performing a debugging operation, in accordance with an example of the present disclosure. The operations 800 may be performed, for example, by a circuit (e.g., the circuitry in the FSR 200 of FIG. 2).

The operations 800 may begin, at optional block 802, with the circuit selecting a root clock for the debugging operation. At optional block 804, the circuit may propagate the selected root clock through a plurality of replicated circuit blocks to a debug controller in the circuit. At block 806, the debug controller may control the plurality of replicated circuit blocks during the debugging operation. The debug controller may be disposed in a clock distribution region coupled to each of the plurality of replicated circuit blocks and configured to distribute at least one clock signal to each of the plurality of replicated circuit blocks.

According to some examples, the operations 800 may further entail receiving, at the debug controller, a trigger input signal from a user design; counting clock cycles of the selected root clock, based on the received trigger input signal; and starting the debugging operation upon the counted clock cycles meeting or exceeding a predetermined count value.

According to some examples, the operations 800 the controlling at block 806 may include outputting a stop clock broadcast signal from the debug controller to the plurality of replicated circuit blocks; sequentially stopping clocks of the replicated circuit blocks based on receipt of the stop clock broadcast signal; and propagating a stop clock done signal to the debug controller based on the stopped clocks. For some examples, the controlling further involves outputting a reset disable signal from the debug controller to the plurality of replicated circuit blocks. For some examples, the operations 800 further entail the circuit scan dumping contents of flops in one or more scan chains routed through the plurality of replicated circuit blocks, after the debug controller receives the stop clock done signal.

According to some examples, the plurality of replicated circuit blocks is in a fabric sub-region (FSR) of a programmable integrated circuit (IC).

According to some examples, the debugging operation includes a clock stop and scan dump (CSSD) for the plurality of replicated circuit blocks.

According to some examples, the plurality of replicated circuit blocks includes block random access memory (BRAM), UltraRAM (URAM), digital signal processing (DSP) blocks, or configurable logic elements (CLEs).

Another example of the present disclosure is a circuit with debugging support. The circuit generally includes a plurality of replicated circuit blocks and a clock distribution region. The clock distribution region is coupled to each of the plurality of replicated circuit blocks, is configured to distribute at least one clock signal to each of the plurality of replicated circuit blocks, and includes a debug controller configured to control the plurality of replicated circuit blocks during a debugging operation.

According to some examples, the plurality of replicated circuit blocks is in an FSR of a programmable IC.

According to some examples, the debugging operation includes a CSSD for the plurality of replicated circuit blocks.

According to some examples, the debug controller is configured to broadcast a stop clock signal to each of the plurality of replicated circuit blocks.

According to some examples, each of the plurality of replicated circuit blocks includes logic configured to propagate a stop clock done signal to the debug controller or to an adjacent circuit block in the plurality of replicated circuit blocks.

According to some examples, each of the plurality of replicated circuit blocks includes at least one of a sleep marker flop or a shutdown marker flop.

According to some examples, each of the plurality of replicated circuit blocks includes one or more scan chains capable of bidirectional propagation.

According to some examples, the plurality of replicated circuit blocks includes BRAM, URAM, DSP blocks, or CLEs.

Examples of the present disclosure provide an efficient infrastructure for system debug of multiple small blocks in a tiled architecture using a CSSD scheme, which can also be utilized for emulation use cases. The existing unused area in RCLK may be used to implement a DFx controller, and the distributed logic in each block instance incurs insignificant overhead to support the CSSD scheme. Minimal fabric resources are employed to support this CSSD scheme per FSR column, which helps ensure minimal perturbation to the existing user design. The user may route a trigger input to the DFx controller in RCLK, a scan clock input to a single block instance (e.g., above RCLK), a stop clock done status output, and scan data output to capture the scan dump. The user can use the infrastructure described herein to debug one or more FSR columns concurrently, as desired. For some examples, a deterministic clock stopping option is provided, with slightly more fabric overhead to support this option.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A circuit with debugging support, comprising:
    a plurality of replicated circuit blocks; and
    a clock distribution region coupled to each of the plurality of replicated circuit blocks and configured to distribute at least one clock signal to each of the plurality of replicated circuit blocks, the clock distribution region comprising a debug controller configured to control the plurality of replicated circuit blocks during a debugging operation.

2. The circuit of claim 1, wherein the plurality of replicated circuit blocks is in a fabric sub-region (FSR) of a programmable integrated circuit (IC).

3. The circuit of claim 1, wherein the debugging operation comprises a clock stop and scan dump (CSSD) for the plurality of replicated circuit blocks.

4. The circuit of claim 1, the debug controller is configured to broadcast a stop clock signal to each of the plurality of replicated circuit blocks.

5. The circuit of claim 1, wherein each of the plurality of replicated circuit blocks comprises logic configured to propagate a stop clock done signal to the debug controller or to an adjacent circuit block in the plurality of replicated circuit blocks.

6. The circuit of claim 1, wherein each of the plurality of replicated circuit blocks comprises at least one of a sleep marker flop or a shutdown marker flop.

7. The circuit of claim 1, wherein each of the plurality of replicated circuit blocks comprises one or more scan chains capable of bidirectional propagation.

8. The circuit of claim 1, wherein the plurality of replicated circuit blocks comprises block random access memory (BRAM), UltraRAM (URAM), digital signal processing (DSP) blocks, or configurable logic elements (CLEs).

9. A method of performing a debugging operation, comprising:
    controlling, with a debug controller, a plurality of replicated circuit blocks during the debugging operation, the debug controller being disposed in a clock distribution region coupled to each of the plurality of replicated circuit blocks and configured to distribute at least one clock signal to each of the plurality of replicated circuit blocks.

10. The method of claim 9, further comprising:
    selecting a root clock for the debugging operation; and
    propagating the selected root clock through the plurality of replicated circuit blocks to the debug controller.

11. The method of claim 10, further comprising:
    receiving, at the debug controller, a trigger input signal from a user design;
    based on the received trigger input signal, counting clock cycles of the selected root clock; and
    starting the debugging operation upon the counted clock cycles meeting or exceeding a predetermined count value.

12. The method of claim 9, wherein the controlling comprises:
    outputting a stop clock broadcast signal from the debug controller to the plurality of replicated circuit blocks;
    sequentially stopping clocks of the replicated circuit blocks based on receipt of the stop clock broadcast signal; and
    propagating a stop clock done signal to the debug controller based on the stopped clocks.

13. The method of claim 12, wherein the controlling further comprises outputting a reset disable signal from the debug controller to the plurality of replicated circuit blocks.

14. The method of claim 12, further comprising scan dumping contents of flops in one or more scan chains routed through the plurality of replicated circuit blocks, after the debug controller receives the stop clock done signal.

15. The method of claim 9, wherein the plurality of replicated circuit blocks is in a fabric sub-region (FSR) of a programmable integrated circuit (IC).

16. The method of claim 9, wherein the debugging operation comprises a clock stop and scan dump (CSSD) for the plurality of replicated circuit blocks.

17. The method of claim 9, wherein the plurality of replicated circuit blocks comprises block random access memory (BRAM), UltraRAM (URAM), digital signal processing (DSP) blocks, or configurable logic elements (CLEs).

\* \* \* \* \*